United States Patent
Park et al.

(10) Patent No.: US 8,526,251 B2
(45) Date of Patent: Sep. 3, 2013

(54) SEMICONDUCTOR APPARATUS, METHOD FOR DELAYING SIGNAL THEREOF, STACKED SEMICONDUCTOR MEMORY APPARATUS, AND METHOD FOR GENERATING SIGNAL THEREOF

(75) Inventors: Heat Bit Park, Ichon-shi (KR); Kee Teok Park, Ichon-shi (KR)

(73) Assignee: SK Hynix Inc., Gyeonggi-do (KR)

(*) Notice: Subject to any disclaimer, the term of this patent is extended or adjusted under 35 U.S.C. 154(b) by 208 days.

(21) Appl. No.: 12/970,882

(22) Filed: Dec. 16, 2010

(65) Prior Publication Data

US 2012/0105124 A1 May 3, 2012

(30) Foreign Application Priority Data

Oct. 29, 2010 (KR) .................. 10-2010-0106880

(51) Int. Cl.
*G11C 7/00* (2006.01)
(52) U.S. Cl.
USPC ........................................... 365/194
(58) Field of Classification Search
USPC ..................................... 365/194; 327/202
See application file for complete search history.

(56) References Cited

U.S. PATENT DOCUMENTS

| 2003/0086330 | A1 | 5/2003 | Chung |
| 2004/0239371 | A1* | 12/2004 | Lee ................................... 327/50 |
| 2006/0231928 | A1 | 10/2006 | Dotta et al. |
| 2008/0043548 | A1 | 2/2008 | Jung et al. |
| 2008/0080271 | A1* | 4/2008 | Kim .............................. 365/194 |
| 2008/0297228 | A1* | 12/2008 | Kim .............................. 327/512 |
| 2010/0020583 | A1 | 1/2010 | Kang et al. |

FOREIGN PATENT DOCUMENTS

KR 1020080101151 A 11/2008

* cited by examiner

*Primary Examiner* — Vanthu Nguyen
*Assistant Examiner* — Khamdan Alrobaie
(74) *Attorney, Agent, or Firm* — William Park & Associates Patent Ltd.

(57) ABSTRACT

The semiconductor apparatus includes a reference delay value check unit configured to receive a source signal and delay the source signal to generate a reference delay signal; a process delay value check unit configured to receive the source signal and delay the source signal to generate a process delay signal; and a signal generation unit configured to receive the reference delay signal and the process delay signal, receive an input signal, and variably delay the input signal based on the reference delay signal and the process delay signal to generate an output signal.

26 Claims, 4 Drawing Sheets

SEMICONDUCTOR APPARATUS, METHOD FOR DELAYING SIGNAL THEREOF, STACKED SEMICONDUCTOR MEMORY APPARATUS, AND METHOD FOR GENERATING SIGNAL THEREOF

CROSS-REFERENCES TO RELATED APPLICATION

The present application claims priority under 35 U.S.C. §119(a) to Korean Patent Application No. 10-2010-0106880, filed on Oct. 29, 2010, in the Korean Intellectual Property Office, which is incorporated herein by reference in its entirety as if set forth in full.

BACKGROUND

1. Technical Field

This disclosure relates to a semiconductor apparatus, and is more particularly, to a stacked semiconductor memory apparatus.

2. Related Art

A three-dimensional arrangement structure having a plurality of memory chips stacked therein is used to improve the degree of integration of a semiconductor memory. A semiconductor memory apparatus using the three-dimensional arrangement structure may be referred to as a stacked semiconductor memory apparatus.

In the stacked semiconductor memory apparatus, each memory chip can be called a slice, and slices may be differently coupled to one another depending on the stacking mechanisms of the stacked semiconductor memory apparatus. Stacking mechanisms of the stacked semiconductor memory apparatus may include a system in package (SIP) method, a package on package (POP) method, a through-silicon via (TSV) method and the like. According to the stacking mechanisms, the slices may be electrically connected to one another using balls, wires or bumps. The TSV method has been proposed as stack method solution for overcoming the reduction in a transmission speed due to the distance to a controller, weakness of a data bandwidth, and the deterioration of data transmission characteristics due to various variables on a package.

Figure 1:
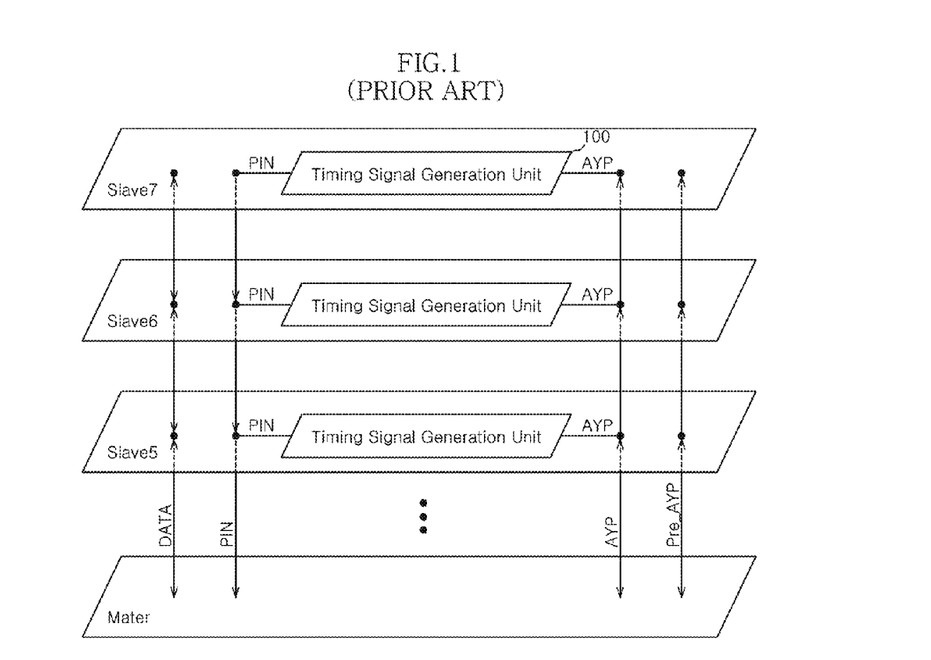
FIG. 1 is a schematic diagram of a typical stacked semiconductor memory apparatus using a TSV method.

FIG. 1 is a schematic diagram of a stacked semiconductor memory apparatus using a typical TSV method. The stacked semiconductor memory apparatus illustrated in FIG. 1 has a configuration in which a master chip Master controls a plurality of is slave chips Slave. The typical stacked semiconductor memory apparatus illustrated in FIG. 1 operates as follows.

When a read or write command is generated from the master chip of the stacked semiconductor memory apparatus, the master chip transmits a first timing signal AYP to the plurality of slave chips Slave. The first timing signal AYP may serve as a source signal of various timing signals generated for a read or write operation by the plurality of slave chips Slave. The first timing signal AYP may also individually exist in each of the plurality of slave chips Slave, and one first timing signal AYP may also be shared by the plurality of slave chips Slave through a single path (such as a TSV in the TSV method). The number of TSVs in the contemporary stacked semiconductor memory apparatus using the TSV method has been gradually reduced from the consideration of a layout and an available area so that the first timing signal AYP illustrated in FIG. 1 may be formed of a single signal transmitted through a single path (for example, a TSV) shared by the plurality of slave chips Slave.

After the first timing signal AYP is received, the plurality of slave chips Slave generate various timing signals for a read or write operation through respective timing signal generation units 100. The various timing signals will be described later with reference to FIG. 2. Each of the plurality of slave chips Slave generates second timing signals PIN for a read operation. The second timing signal PIN includes synchronization information required when the plurality of slave chips Slave transmit data to the master chip. The master chip is receives the data, which is transmitted from the plurality of slave chips Slave, in synchronization with the second timing signal PIN. In the stacked semiconductor memory apparatus illustrated in FIG. 1, the plurality of slave chips Slave may share a single path for the second timing signals PIN transmitted to the master chip. Furthermore, the plurality of slave chips Slave may share a single path for the data transmitted to the master chip. Accordingly, the second timing signal PIN should be activated at an accurate timing. In more detail, since the plurality of slave chips Slave and the master chip share a path for data being transmitted and a path for the second timing signal PIN being transmitted, it is necessary for each slave chip Slave to accurately transmit the data and the second timing signal PIN within the time for using the path. Here, skew for the second timing signal PIN may be problematic. Each slave chip Slave generates the second timing signal PIN after a predetermined time passes from the point of time at which the first timing signal AYP is triggered. However, the second timing signal PIN generated by each slave chip Slave may be deviated from a target point of time due to PVT (process, voltage, temperature) variation. Moreover, since each slave chip Slave may be fabricated from different wafers rather than the same wafer, the second timing signal PIN is significantly affected by process variation. Such skew of the second timing signal PIN reduces a timing margin, resulting in the reduction in effective data area such as data eye.

One problem with typical stacked semiconductor apparatus is deterioration of operation due to skew. As well as the second timing signal PIN, skew for internal signals of each slave chip Slave deteriorates the operation characteristics of a stacked semiconductor memory apparatus. Furthermore, timing margins of various internal signals have been gradually reduced with the high speed operation of a semiconductor memory apparatus. In this regard, there has been increasing demand for a stacked semiconductor memory apparatus capable of correcting the skew for internal signals of each slave chip Slave.

Figure 2:
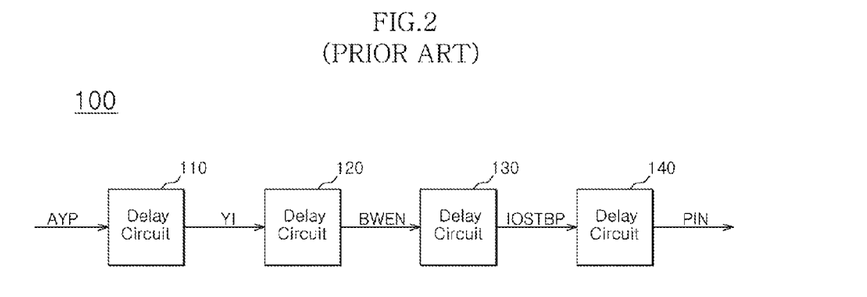
FIG. 2 is a detailed block diagram of the typical timing signal generation unit illustrated in FIG. 1.

FIG. 2 is a detailed block diagram of the typical timing signal generation unit 100 illustrated in FIG. 1.

As mentioned above, the timing signal generation unit 100 included in each slave chip Slave generates internal timing signals required for read and write operations thereof. The internal timing signals may include a first application signal YI, a second application signal BWEN, a third application signal IOSTBP, and a second timing signal PIN. The first application signal YI is used to control an electrical connection between segment input/output lines and bit lines and bit bar lines in a read or write operation. The second application signal BWEN is used to control an electrical connection between input/output lines different from each other in a write operation. The third application signal IOSTBP is used to control an electrical connection between lines different from each other in a read operation. The second timing signal PIN is outputted from the final terminal of the timing signal generation unit 100 and includes the synchronization information required when the plurality of slave chips Slave transmit data to the master chip as mentioned above. The timing signal generation unit 100 includes a plurality of delay circuits 110, 120, 130 and 140. If the first timing signal AYP is received, output units of the plurality of delay circuits 110, 120, 130 and 140 output the first application signal YI, the second application signal BWEN, the third application signal IOSTBP, and the second timing signal PIN, respectively. As mentioned above, the second timing signal PIN is outputted from the final terminal of the delay circuit constituting the timing signal generation unit 100. This means that many transistors may exist from the reception of the first timing signal AYP to the generation of the second timing signal PIN, as compared with the number of the first application signal YI, the second application signal BWEN and the third application signal IOSTBP, and thus the largest skew due to the PVT variation occurs in the second timing signal PIN.

A third timing signal Pre_AYP illustrated in FIG. 1 is transmitted from the master chip to the plurality of slave chips Slave, is advanced as compared with the first timing signal AYP, and includes reception timing information of an address signal (not shown) transmitted from the master chip to the plurality of slave chips Slave.

SUMMARY

Accordingly, there is a need for an improved semiconductor apparatus that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment, a semiconductor apparatus may include: a reference delay value check unit configured to receive a source signal and delay the source signal to generate a reference delay signal; a process delay value check unit configured to receive the source signal and delay the source signal to generate a process delay signal; and a signal generation unit configured to receive the reference delay signal and the process delay signal, receive an input signal, and variably delay the input signal based on the reference delay signal and the process delay signal to generate an output signal.

In another exemplary embodiment, a method for delaying a signal of a semiconductor apparatus may include the steps of: comparing a reference delay value with a process delay value; and variably delaying an input signal based on a comparison result obtained by comparing the reference delay value with the process delay value, thereby generating an output signal.

In another exemplary embodiment, a stacked semiconductor memory apparatus may include: a master chip; and a plurality of slave chips, wherein the plurality of slave chips are configured to commonly receive an input signal from the master chip, and include variable delay units configured to receive a reference delay value and a process delay value to generate an output signal by variably delaying the input signal based on the reference delay value and the process delay value, respectively.

In another exemplary embodiment, a method for generating a signal of a stacked semiconductor memory apparatus may include the steps of: transmitting by a master chip a first timing signal to a plurality of slave chips; comparing by each slave chip a reference delay value with a process delay value; and generating by each slave chip a delay timing signal by variably delaying the first timing signal based on a result obtained by comparing the reference delay value with the process delay value.

In another exemplary embodiment, a stacked semiconductor memory apparatus may include: a master chip; and a plurality of slave chips, wherein the plurality of slave chips are configured to receive an input signal from the master chip, and wherein each slave chip includes: a first delay circuit having a delay value unrelated to a process; a second delay circuit having a delay value related to the process; and a delay compensation circuit configured to compare the delay value unrelated to the process with the delay value related to the process and compensate for a delay value of the input signal.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

An exemplary stacked semiconductor memory apparatus variably delays a first timing signal AYP based on PVT variation applied to each slave chip Slave, thereby correcting skew which may is occur in each slave chip Slave.

Figure 3:
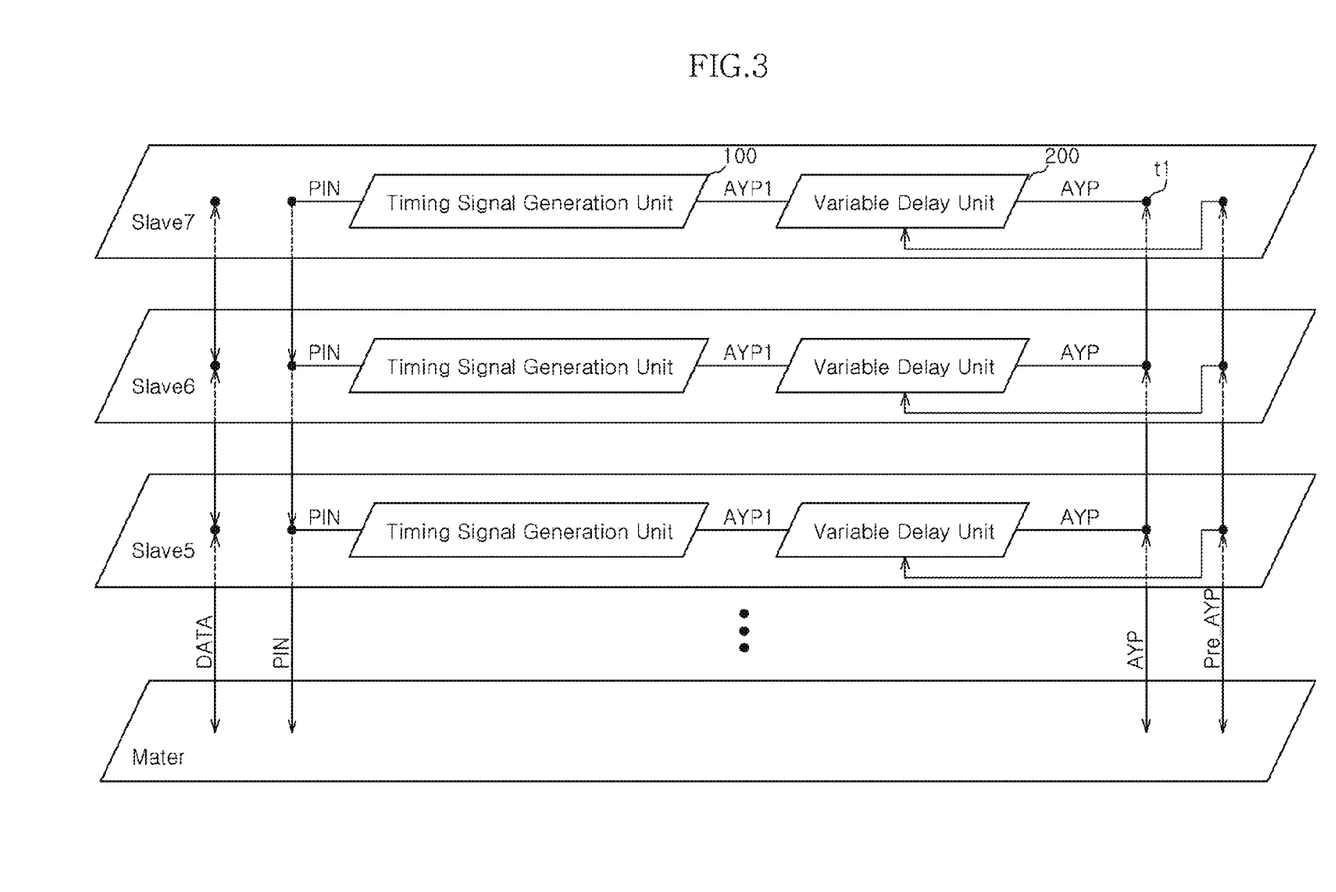
FIG. 3 is a schematic diagram of a stacked semiconductor memory apparatus according to an exemplary embodiment.

FIG. 3 is a schematic diagram illustrating a stacked semiconductor memory apparatus according to an exemplary embodiment of the invention. In the stacked semiconductor memory apparatus illustrated in FIG. 3, a variable delay unit 200 is further provided between a reception terminal t1 of the first timing signal AYP, which is transmitted from a master chip to a plurality of slave chips Slave, and a timing signal generation unit 100.

The variable delay unit 200 may be configured to detect PVT variation in each slave chip Slave, generate a delay timing signal AYP1 by variably delaying the first timing signal AYP based on the PVT variation, and supply the timing signal generation unit 100 with the delay timing signal AYP1.

The variable delay unit 200 may detect the PVT variation in each slave chip Slave before each slave chip Slave receives the first timing signal AYP. Accordingly, an operation in which the variable delay unit 200 detects the PVT variation in each slave chip Slave may be performed in response to a signal (for example, a third timing signal Pre_AYP) which is activated before the first timing signal AYP.

The variable delay unit 200 may supply the timing signal generation unit 100 with the delay timing signal AYP1 obtained by variably delaying the first timing signal AYP based on the PVT variation, so that the timing signal generation unit 100 included in each slave chip Slave may generate a second timing signal PIN which is activated at a target timing. That is, skew of internal timing signals including the second timing signal PIN can be reduced. The skew of the internal timing signals of the plurality of slave chips Slave can be reduced through the variable delay units 200, so that a timing margin in the process of transmitting signals of the stacked semiconductor memory apparatus can be increased, thereby providing advantages in the high speed operation of the stacked semiconductor memory apparatus. In addition, it is possible to reduce the necessity that the plurality of slave chips Slave should use a plurality of paths for transmitting the second timing signal PIN because the plurality of paths are not integrated into a single path due to the excessive skew of the internal timing signals. In a stacked semiconductor memory apparatus using the TSV method, the reduction in the demand for unnecessary paths may be advantageous in terms of the layout, area and degree of integration.

Figure 4:
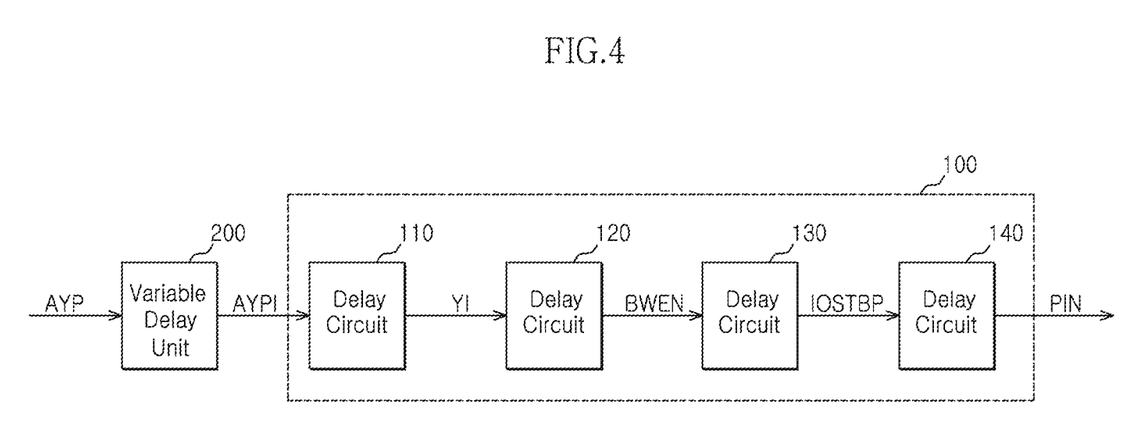
FIG. 4 is a detailed block diagram of the timing signal generation unit and the variable delay unit illustrated in FIG. 3.

FIG. 4 is a detailed block diagram illustrating the timing signal generation unit 100 and the variable delay unit 200 illustrated in FIG. 3. As illustrated in FIG. 3, the variable delay unit 200 may be included in each slave chip Slave and coupled between a reception terminal of the first timing signal AYP and an input terminal of the timing signal generation unit 100. As mentioned above, the variable delay unit 200 may be configured to detect the PVT variation in a corresponding slave chip Slave and supply the timing signal generation unit 100 with the delay timing signal AYP1 obtained by variably delaying the first timing signal AYP based on the PVT variation. The timing signal generation unit 100 may have a configuration substantially equal to the timing signal generation unit 100 illustrated in FIG. 2. Since the timing signal generation unit 100 may operate similarly to the timing signal generation unit 100 illustrated in FIG. 2, except that the timing signal generation unit 100 illustrated in FIG. 2 receives the first timing signal AYP but the timing signal generation unit 100 receives the delay timing signal AYP1 from the variable delay unit 200, detailed description thereof will be omitted.

Figure 5:
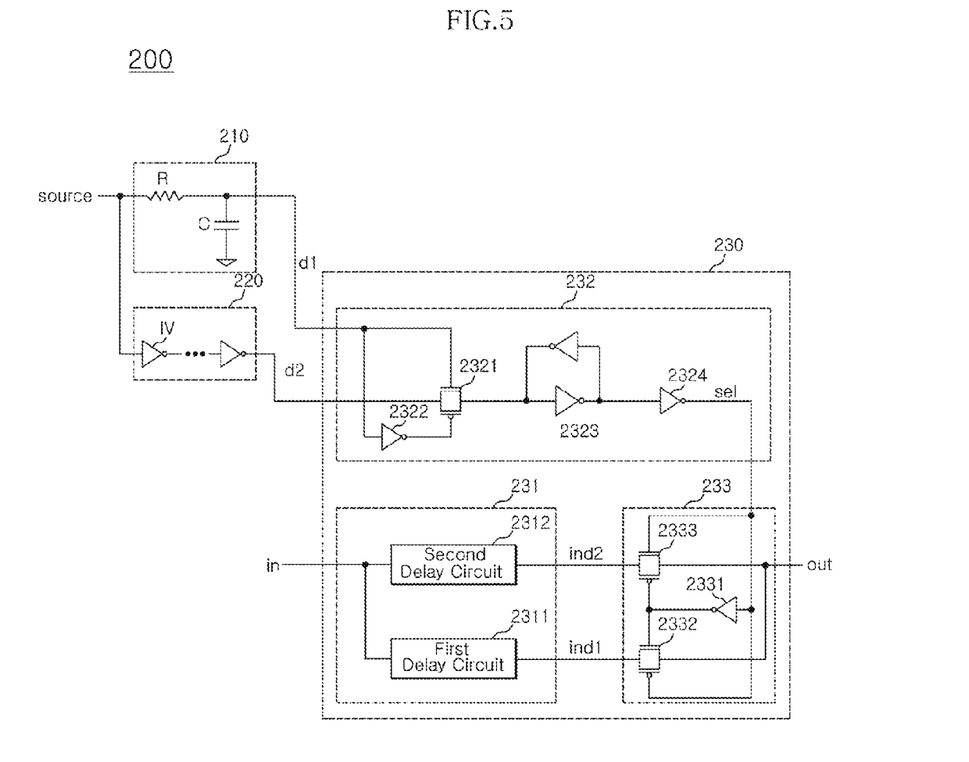
FIG. 5 is a circuit diagram of the variable delay unit illustrated in FIGS. 3 and 4.

FIG. 5 is a circuit diagram illustrating the variable delay unit 200 illustrated in FIGS. 3 and 4.

The variable delay unit 200 is configured to detect the PVT variation in a corresponding slave chip Slave and generate an output signal 'out' by variably delaying an input signal 'in' based on the PVT variation. In FIGS. 3 and 4, the input signal 'in' corresponds to the first timing signal AYP and the output signal 'out' corresponds to the delay timing signal AYP1.

The detection of the PVT variation in the corresponding slave chip Slave may be performed by comparing a reference delay value with a process delay value. More precisely, the variable delay unit 200 is configured to delay a source signal 'source' through delay circuits with two configurations. The delay circuits with the two configurations may include circuits in which a delay value is variously changed based on the PVT variation. In general, in a semiconductor memory apparatus, a delay circuit generally may have two configurations. One is a delay circuit using RC delay and the other is one is a delay circuit using a plurality of inverters. The delay circuit using the RC delay has a delay time which is proportional to the multiplication of resistance and capacitance, and the delay circuit using the plurality of inverters has a delay time based on the current amount of transistors constituting the inverters and the number of the inverters. Accordingly, the delay time of the delay circuit using the plurality of inverters is significantly affected by the operation characteristics of the transistors. The delay time of the delay circuit using the RC delay may be relatively insensitive (such as, for example, about 30%) to the PVT variation, as compared with the delay circuit using the plurality of inverters. In this regard, the delay circuit using the RC delay and the delay circuit using the plurality of inverters are suitable for the delay circuits with the two configurations of the variable delay unit 200. The delay time of the delay circuit using the RC delay having delay time variation relatively insensitive to the PVT variation will be referred to as a reference delay value (or a delay value unrelated to a process), and the delay time of the delay circuit using the plurality of inverters having delay time variation relatively sensitive to the PVT variation, as compared with the delay circuit using the RC delay, will be referred to as a process delay value (or a delay value related to a process). The delay circuits with the two configurations may include all delay circuits having different delay time variations based on the PVT variation. However, it should be noted that the fact that the delay circuits (refer to reference numerals 210 and 220 of FIG. 5) with the two configurations includes the delay circuit using the RC delay and the delay circuit using the plurality of inverters does not limit to necessary elements for realizing the invention.

As illustrated in FIG. 5, the variable delay unit 200 may include a reference delay value check unit 210, a process delay value check unit 220, and a signal generation unit 230.

The reference delay value check unit 210 may be configured to delay the source signal 'source' and generate a reference delay signal d1. As illustrated in FIG. 5, the reference delay value check unit 210 may include a delay circuit having a resistor R and a capacitor C.

The process delay value check unit 220 may be configured to delay the source signal 'source' and generate a process delay signal d2. As illustrated in FIG. 5, the process delay value check unit 220 may include a delay circuit having a plurality of inverters IV.

The signal generation unit 230 may be configured to variably delay the input signal 'in' based on the reference delay signal d1 and the process delay signal d2 and generate the output signal 'out'.

The source signal 'source' may use a signal activated earlier as compared with the input signal 'in'. In FIGS. 3 and 4, the source signal 'source' may correspond to the third timing signal Pre_AYP. In FIGS. 3 and 4, it should be noted that the invention is not limited to the use of the third timing signal Pre_AYP as the source signal 'source' as a prerequisite element for realizing the invention.

The reference delay value check unit 210 and the process delay value check unit 220 may receive and delay the source signal 'source' in the same manner. Consequently, a difference between the delay time of the reference delay signal d1 and the delay time of the process delay signal d2, which are generated by the reference delay value check unit 210 and the process delay value check unit 220, may be information indicating the degree by which a corresponding slave chip Slave has been affected by the PVT variation. When the delay time of the process delay signal d2 is shorter than the delay time of the reference delay signal d1, it may mean that transistors of the corresponding slave chip Slave operate at a high speed. However, when the delay time of the process delay signal d2 is longer than the delay time of the reference delay signal d1, it may mean that transistors of the corresponding slave chip Slave operate at a low speed. Consequently, while the variable delay unit 200 variably delays the input signal 'in' to generate the output signal 'out', the variable delay unit 200 may delay the input signal 'in' by a first delay time to output the output signal 'out' when the delay time of the process delay signal d2 is longer than the delay time of the reference delay signal d1, and delay the input signal 'in' by a second delay time longer than the first delay time to output the output signal 'out' when the delay time of the process delay signal d2 is shorter than the delay time of the reference delay signal d1.

The signal generation unit 230 may include a delay signal generation section 231, a selection signal generation section 232, and a signal output section 233.

The delay signal generation section 231 may be configured to delay the input signal 'in' by the first delay time to generate a first delay signal ind1, and delay the input signal 'in' by the second delay time to generate a second delay signal ind2. The delay signal generation section 231 may include a first delay circuit 2311 and a second delay circuit 2312. The first delay circuit 2311 delays the input signal 'in' by the first delay time to generate the first delay signal ind1 and the second delay circuit 2312 delays the input signal 'in' by the second delay time to generate the second delay signal ind2. The first delay circuit 2311 and the second delay circuit 2312 may include general delay circuits, respectively.

The selection signal generation section 232 may be configured to compare the reference delay signal d1 with the process delay signal d2 and generate a selection signal sel. As illustrated in FIG. 5, the selection signal generation section 232 may include a pass gate 2321, an inverter 2322, a latch circuit 2323, and an inverter 2324. The inverter 2322 inverts the reference delay signal d1. The pass gate 2321 allows the process delay signal d2 to pass therethrough in response to the reference delay signal d1 and an output signal of the inverter 2322. The latch circuit 2323 latches an output signal of the pass gate 2321. The inverter 2324 inverts an output signal of the latch circuit 2323 and output the inverted output signal as the selection signal sel. The selection signal generation section 232 configured as illustrated in FIG. 5 inverts a logic value of the process delay signal d2 to latch the process delay signal d2 as the selection signal sel when the reference delay signal d1 falls to a low level from a high level. Thus, when the process delay signal d2 has a high level pulse width longer than that of the reference delay signal d1, the selection signal generation section 232 latches the selection signal sel at a low level. However, when the process delay signal d2 has a high level pulse width shorter than that of the reference delay signal d1, the selection signal generation section 232 latches the selection signal sel at a high level.

The signal output section 233 may be configured to select one of the first delay signal ind1 and the second delay signal ind2 in response to the selection signal sel and output the selected signal as the output signal 'output'. As illustrated in FIG. 5, the signal output section 233 may include an inverter 2331, a pass gate 2332, and a pass gate 2333. The inverter 2331 inverts and outputs the selection signal sel. The pass gate 2332 allows the first delay signal ind1 to pass therethrough in response to an output signal of the inverter 2331 and the selection signal sel and outputs the first delay signal ind1 as the output signal 'output'. The pass gate 2333 allows the second delay signal ind2 to pass therethrough in response to the selection signal sel and the output signal of the inverter 2331 and outputs the second delay signal ind2 as the output signal 'output'. The signal ouput section 233 illustrated in FIG. 5 outputs the second delay signal ind2 as the output signal 'out' when the selection signal sel is at a high level, and outputs the first delay signal ind1 as the output signal 'out' when the selection signal sel is at a low level.

The stacked semiconductor memory apparatus illustrated in FIGS. 3 to 5 according to an exemplary embodiment is characterized in that each slave chip Slave variably delays the first timing signal AYP based on the PVT variation to correct the skew of internal signals thereof. Such characteristics are not limited to the semiconductor memory apparatus. The invention can be applied to a stacked semiconductor apparatus.

Furthermore, the stacked semiconductor memory apparatus illustrated in FIGS. 3 to 5 according to an embodiment is characterized in that the degree of influence by the PVT variation can be understood by checking the reference delay value and the process delay value. Such characteristics are not limited to the stacked semiconductor memory apparatus. Compensating for the influence by the PVT variation by checking the reference delay value and the process delay value can be applied to all types of semiconductor memory apparatuses, as well as the stacked semiconductor memory apparatus.

The variable delay unit 200 illustrated in FIG. 5 according to an embodiment outputs one of the first delay signal ind1 and the second delay signal ind2 as the delay timing signal AYP1 based on a result obtained by comparing the reference delay value with the process delay value. As illustrated in FIG. 5, since the configuration in which the delay timing signal AYP1 has two delay times is set for the purpose of convenience, it may be possible to employ a configuration in which the delay timing signal AYP1 has three or more delay times as is required, that is, the delay time can be more precisely adjusted. It should be noted that the configuration in which the delay timing signal AYP1 has two steps of delay times as illustrated in FIG. 5 is only exemplary, and the invention is not limited thereto.

In the stacked semiconductor memory apparatus illustrated in FIG. 3, the master chip and the plurality of slave chips Slave are electrically connected to each other through the TSV method. However, the invention is not limited to the stacked semiconductor memory apparatus using the TSV method. For example, the invention can be applied to various types of multichip semiconductor memory apparatuses using a SIP method, a POP method and the like.

While certain embodiments have been described above, it will be understood to those skilled in the art that the embodiments described are by way of example only. Accordingly, the semiconductor apparatus, the method for delaying a signal thereof, the stacked semiconductor memory apparatus, and the method for generating a signal thereof described herein should not be limited based on the described embodiments. Rather, the semiconductor apparatus, the method for delaying a signal thereof, the stacked semiconductor memory apparatus, and the method for generating a signal thereof described herein should only be limited in light of the claims that follow when taken in conjunction with the above description and accompanying drawings.

What is claimed is:

1. A stacked semiconductor memory apparatus comprising:
   a master chip; and
   a plurality of slave chips,
   wherein the plurality of slave chips are configured to receive an input signal from the master chip in common, and include variable delay units configured to generate an output signal by variably delaying the input signal based on a reference delay value and a process delay value, respectively,
   wherein the reference delay value varies in a fashion that is relatively insensitive to process, voltage, and temperature (PVT) variation, and the process delay value varies in a fashion that is relatively more sensitive to process, voltage, and temperature (PVT) variation than the reference delay value.

2. The stacked semiconductor memory apparatus according to claim 1, wherein the variable delay units are configured to output the output signal by delaying the input signal by a first delay time when the process delay value is larger than the reference delay value, and output the output signal by delaying the input signal by a second delay time when the process delay value is smaller than the reference delay value.

3. The stacked semiconductor memory apparatus according to claim 2, wherein the first delay time is shorter than the second delay time.

4. The stacked semiconductor memory apparatus according to claim 2, wherein the variable delay units comprise:
a reference delay value check unit configured to delay a source signal and generate a reference delay signal;
a process delay value check unit configured to delay the source signal and generate a process delay signal; and
a signal generation unit configured to variably delay the input signal based on the reference delay signal and the process delay signal and generate the output signal.

5. The stacked semiconductor memory apparatus according to claim 4, wherein the signal generation unit comprises:
a delay signal generation section configured to delay the input signal by the first delay time to generate a first delay signal and delay the input signal by the second delay time to generate a second delay signal;
a selection signal generation section configured to compare the process delay signal with the reference delay signal and generate a selection signal; and
a signal output section configured to select one of the first delay signal and the second delay signal in response to the selection signal and output a selected signal as the output signal.

6. The stacked semiconductor memory apparatus according to claim 4, wherein the reference delay value check unit includes a delay circuit for delaying the source signal, and the delay circuit performs a delay operation using RC delay.

7. The stacked semiconductor memory apparatus according to claim 4, wherein the process delay value check unit includes a delay circuit for delaying the source signal, and the delay circuit performs a delay operation using a plurality of inverters.

8. The stacked semiconductor memory apparatus according to claim 1, wherein the output signal is a first timing signal, and the plurality of slave chips are configured to generate one or more of a first application signal, a second application signal, a third application signal and a second timing signal in response to the output signal.

9. The stacked semiconductor memory apparatus according to claim 8,
wherein the second timing signal is outputted from the plurality of slave chips to the master chip, and
wherein a plurality of second timing signals outputted from the plurality of slave chips are transmitted through a single path.

10. The stacked semiconductor memory apparatus according to claim 9, wherein the path is provided in a form of through-silicon via.

11. A method for generating a signal of a stacked semiconductor memory apparatus, comprising the steps of:
transmitting by a master chip a first timing signal to a plurality of slave chips;
comparing by each slave chip a reference delay value with a process delay value, wherein the reference delay value varies in a fashion that is relatively insensitive to process, voltage, and temperature (PVT) variation, and the process delay value varies in a fashion that is relatively more sensitive to process, voltage, and temperature (PVT) variation than the reference delay value; and
generating by each slave chip a delay timing signal by variably delaying the first timing signal based on a result obtained by comparing the reference delay value with the process delay value.

12. The method according to claim 11, wherein the first timing signal is a single signal shared by each of the plurality of slave chips.

13. The method according to claim 11, wherein the step of comparing the reference delay value with the process delay value comprises:
generating a reference delay signal by delaying a source signal using RC delay;
generating a process delay signal by delaying the source signal using a plurality of inverters; and
comparing the reference delay signal with the process delay signal.

14. The method according to claim 11, wherein, in the step of generating the delay timing signal, the first timing signal is delayed by a first delay time and generated as the delay timing signal when the process delay value is larger than the reference delay value, the first timing signal is delayed by a second delay time and generated as the delay timing signal when the process delay value is smaller than the reference delay value, and the first delay time is shorter than the second delay time.

15. The method according to claim 11, further comprising a step of:
sequentially generating by each slave chip one or more of a first application signal, a second application signal, a third application signal and a second timing signal after the first timing signal is generated.

16. The method according to claim 15, further comprising a step of:
transmitting by each slave chip the second timing signal to the master chip after a predetermined time passes.

17. The method according to claim 16, wherein, in the step of transmitting the second timing signal to the master chip, the plurality of slave chips transmit the second timing signal through a shared single path.

18. The method according to claim 17, wherein the path is provided in a form of through-silicon via.

19. A stacked semiconductor memory apparatus comprising:
a master chip; and
a plurality of slave chips,
wherein the plurality of slave chips are configured to receive an input signal from the master chip, and
wherein each slave chip comprises:
a first delay circuit having a delay value unrelated to a process;
a second delay circuit having a delay value related to the process; and
a delay compensation circuit configured to compare the delay value unrelated to the process with the delay value related to the process and compensate for a delay value of the input signal.

20. The stacked semiconductor memory apparatus according to claim 19, wherein the delay compensation circuit comprises:
a selection signal generation section configured to compare the delay value unrelated to the process with the delay value related to the process and generate a selection signal;
a delay signal generation section configured to delay the input signal by a first delay time to generate a first delay signal, and delay the input signal by a second delay time to generate a second delay signal; and a signal output section configured to select and output one of the first delay signal and the second delay signal in response to the selection signal.

21. The stacked semiconductor memory apparatus according to claim 19, wherein the first delay circuit is configured to perform a delay operation using RC delay.

22. The stacked semiconductor memory apparatus according to claim 19, wherein the second delay circuit is configured to perform a delay operation using a plurality of inverters.

23. The stacked semiconductor memory apparatus according to claim 20, wherein each slave chip is configured to generate one or more of a first application signal, a second application signal, a third application signal and a second timing signal in response to an output signal of the signal output section.

24. The stacked semiconductor memory apparatus according to claim 23, wherein the second timing signal is outputted from the plurality of slave chips to the master chip, and wherein a plurality of second timing signals outputted from the plurality of slave chips are transmitted to the master chip through a shared single path.

25. The stacked semiconductor memory apparatus according to claim 24, wherein the path is provided in a form of through-silicon via.

26. The stacked semiconductor memory apparatus according to claim 23, wherein the third application signal is used to control an electrical connection of input/output lines different from each other in a read operation.

\* \* \* \* \*